US009703306B2

(12) United States Patent
Day et al.

(10) Patent No.: US 9,703,306 B2
(45) Date of Patent: Jul. 11, 2017

(54) SELF-HEATING TRIM TECHNIQUES FOR IMPROVED LDO ACCURACY OVER LOAD AND TEMPERATURE

(71) Applicant: Analog Devices, Inc., Norwood, MA (US)

(72) Inventors: Brandon Day, Seattle, WA (US); Mark Szostkiewicz, Hampstead, NH (US)

(73) Assignee: Analog Devices, Inc., Norwood, MA (US)

( * ) Notice: Subject to any disclaimer, the term of this patent is extended or adjusted under 35 U.S.C. 154(b) by 350 days.

(21) Appl. No.: 14/482,228

(22) Filed: Sep. 10, 2014

(65) Prior Publication Data

US 2016/0070280 A1 Mar. 10, 2016

(51) Int. Cl.
*G01R 31/02* (2006.01)
*G05F 1/625* (2006.01)

(52) U.S. Cl.
CPC .................................... *G05F 1/625* (2013.01)

(58) Field of Classification Search
CPC ....................................................... G05F 1/625
See application file for complete search history.

(56) References Cited

U.S. PATENT DOCUMENTS 6,075,354 A 6/2000 Smith et al.
6,225,796 B1 5/2001 Nguyen
6,329,804 B1 12/2001 Mercer
6,501,256 B1 12/2002 Jaussi
7,272,523 B1 9/2007 John et al.
7,472,030 B2 12/2008 Scheuerlein
7,543,253 B2 6/2009 Marinca et al.
7,576,598 B2 8/2009 Marinca
8,102,201 B2 1/2012 Marinca
2006/0043957 A1 3/2006 Carvalho
2011/0248688 A1* 10/2011 Iacob ........................ G05F 1/56
323/234

OTHER PUBLICATIONS

"Bandgaps in the Crosshairs: What's the Trim Target?", Power Management—Design Line, (Oct. 18, 2006), 5 pgs.

Marasco, Ken, "How to Apply Low-Dropout Regulators Successfully", Analog Dialogue 43-08, [online]. Retrieved from the Internet: <URL: www.analog.com/analogdialogue>, (Aug. 2009), 1-4.

* cited by examiner

*Primary Examiner* — Daniel Miller
(74) *Attorney, Agent, or Firm* — Schwegman, Lundberg & Woessner, P.A.

(57) ABSTRACT

In one example, a method for compensating for a temperature effect during operation of a voltage regulator circuit includes applying a load current at an output of the voltage regulator circuit, measuring a first output voltage at the output, measuring a reference current or voltage, increasing the load current, measuring a change in the reference current or voltage corresponding to the increased load current, measuring a second output voltage when the measured change in the reference current exceeds a threshold, and determining a temperature coefficient (TC) value based on the measured second output voltage.

15 Claims, 5 Drawing Sheets

SELF-HEATING TRIM TECHNIQUES FOR IMPROVED LDO ACCURACY OVER LOAD AND TEMPERATURE

TECHNICAL FIELD

This disclosure relates generally to semiconductor processes and circuitry.

BACKGROUND

Within the field of semiconductor circuits, certain categories of circuitry require a reliable operation over a range of temperatures. One circuit that may be used to provide a constant reference source is a bandgap voltage reference.

Bandgap voltage reference circuits are well known in the art. Such circuits are designed to sum two voltages with opposite temperature slopes. One of the voltages is a Complementary-To-Absolute Temperature (CTAT) voltage typically provided by a base-emitter voltage (VBE) of a forward biased bipolar transistor. The other is a Proportional-To-Absolute Temperature (PTAT) voltage typically derived from the base-emitter voltage differences of two bipolar transistors operating at different collector current densities. When the PTAT voltage and the CTAT voltage are summed together the summed voltage is at a first order temperature insensitive.

In typical bandgap voltage references, the output voltage requires trimming or adjusting so as to achieve a constant output voltage reference over a range of temperatures. This is typically achieved by altering the PTAT voltage because it is more difficult to alter the CTAT voltage due to the exponential relationship between the current and the base-emitter voltage of a bipolar transistor. Typically, both the absolute voltage and the temperature slope of a bandgap voltage reference must be trimmed, with the assumption that the base-emitter voltage of the bipolar transistor has a precise value at absolute zero. The base emitter voltage at zero Kelvin is known as the bandgap voltage. Due to the process variations, both the output voltage and the temperature slope or temperature coefficient (TC) for a real bandgap voltage reference will have different values from device to device. This causes problems if a precise absolute voltage and minimum temperature coefficient are required. When the PTAT voltage is adjusted at room temperature so as to correct the temperature slope, the adjustment turns the slope around 0 Kelvin, which causes the absolute voltage to also change. Therefore, once the temperature slope has been corrected, the absolute voltage must also be corrected. This correction in absolute voltage may in turn alter the temperature slope. As a result, the trimming process typically requires the step of correction of the temperature slope followed by the step of correction of the absolute voltage to be repeated several times. This means that when a precise absolute voltage and minimum temperature coefficient is required, a lengthy iterative process of trimming slope and absolute voltage must be employed.

Another way to trim the reference voltage is to record a minimum of two reference voltage values at two different temperatures, in order to find the temperature slope, and then to adjust the PTAT voltage by a corresponding amount and shift the reference voltage (or the gain) with a temperature constant value. However temperature trimming of units in production quantities using this technique has the drawback of requiring multiple handling and tracking of the individual units during temperature test.

A number of techniques have been developed to provide for the compensation of the temperature effect. An example of such a technique is disclosed in U.S. Pat. No. 6,075,354 (the content of which is incorporated herein by way of reference). In this document, three currents DAC's are provided to interface with a bandgap voltage generator, a first provided to trim first order temperature slope variations of the output reference voltage, a second to compensate for temperature slope curvature and a third to provide scalar gain adjustment. In order to adjust ΔVBE for the slope correction, the technique is used of pushing an external correction current through the first or second diode of the main bandgap cell. A drawback of this scheme is that as the PTAT voltage changes, the reference voltage slope also changes, which affects the absolute value of the reference voltage.

U.S. Pat. No. 6,329,804 also describes a slope and level trim DAC for voltage references. In order to trim the reference voltage slope, a current switching DAC is used to inject a PTAT trimming current into one of the two diodes in the main bandgap cell. However, as in the case of U.S. Pat. No. 6,075,354, this patent also has the drawback that a change in ΔVBE changes both the slope and absolute value of the reference voltage.

Overview

This disclosure describes a self-heating trimming technique that can improve the output voltage accuracy of a low-dropout regulator (LDO) over line, load, and temperature. As described in more detail below, the technique can include self-heating a voltage regulator circuit, e.g., LDO regulator, by increasing the external load current, thus increasing the power dissipation through the circuit. This results in a thermal increase in die junction temperature that can be accurately monitored along with a change in the output voltage. Thus, a change in output voltage versus change in temperature can be measured and, based on this change, a bandgap reference temperature coefficient (TC) code can be trimmed to minimize the change in output voltage versus die junction temperature (as measured through the PTAT or CTAT bias current) and load current. The techniques of this disclosure can improve the temperature bow of the bandgap voltage reference, which is caused by the non-linearity of the base-emitter voltage (VBE) of the forward biased bipolar transistor (the complementary-to-absolute temperature (CTAT) voltage).

In one example, this disclosure is directed to a method for compensating for a temperature effect during operation of a voltage regulator circuit. The method comprises applying a load current at an output of the voltage regulator circuit, measuring a first output voltage at the output, measuring a reference current or voltage, increasing the load current, measuring a change in the reference current or voltage corresponding to the increased load current, measuring a second output voltage when the measured change in the reference current exceeds a threshold, and determining a temperature coefficient (TC) value based on the measured second output voltage.

In another example, this disclosure is directed to a method for compensating for a temperature effect during operation of a low dropout regulator circuit. The method comprises applying only one temperature to the voltage regulator circuit, applying a load current at an output of the voltage regulator circuit, measuring a first output voltage at the output, measuring a reference current, increasing the load current, measuring a change in the reference current corresponding to the increased load current, measuring a second output voltage when the measured change in the reference current exceeds a threshold, determining a temperature coefficient (TC) value based on the measured second output voltage, and modifying a resistance of a variable resistance based on the determined TC value by burning or blowing at least one polysilicon fuse.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
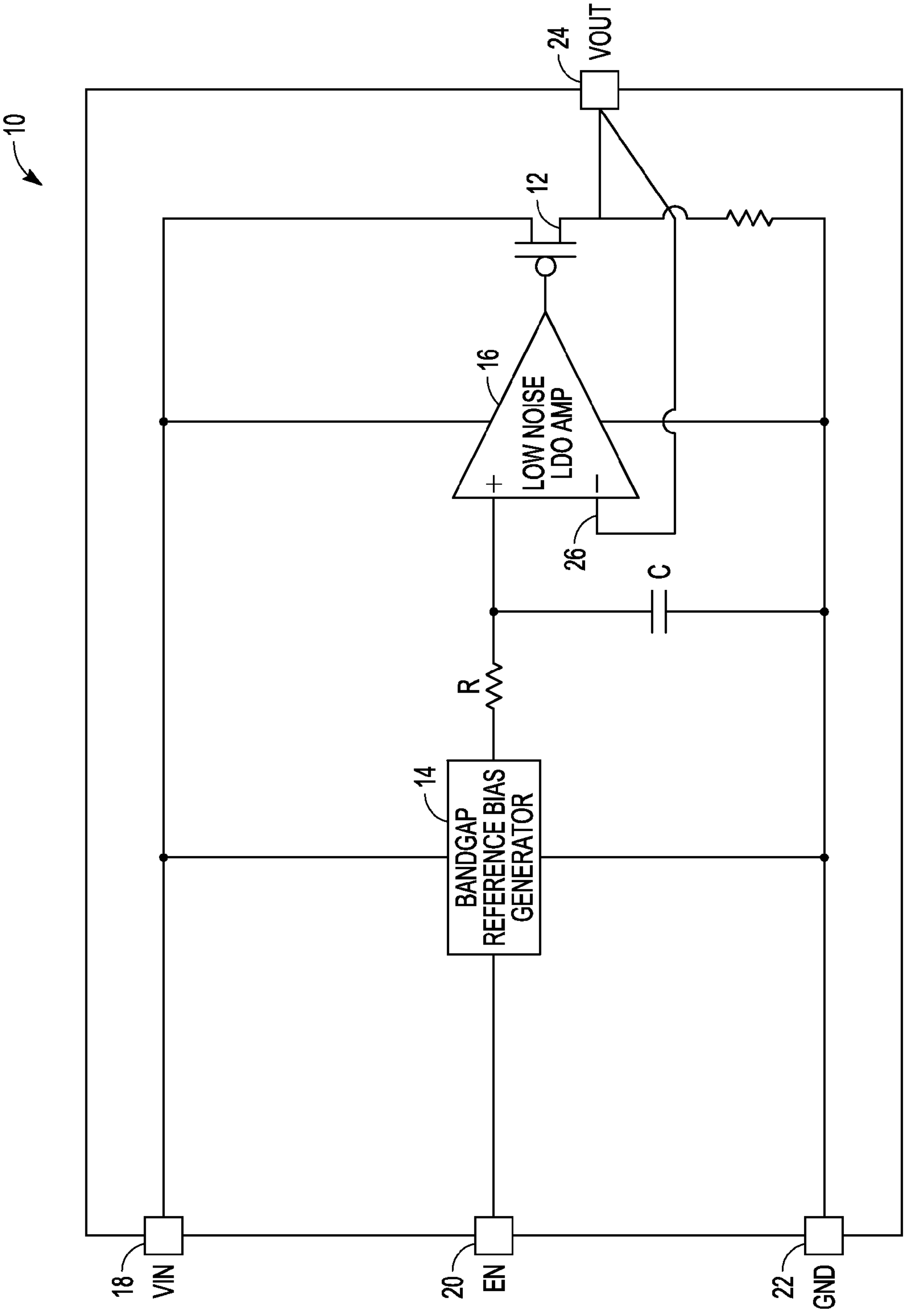
FIG. 1 is an example of a block diagram of an LDO voltage regulator architecture.

FIG. 1 is an example of a block diagram of an LDO voltage regulator architecture. The voltage regulator 10, e.g., an LDO regulator, can include a pass transistor 12, a bandgap voltage reference 14, and an error amplifier 16. The example regulator 10 of FIG. 1 can include 4 pins, namely an input voltage (VIN) pin 18, an enable (EN) pin 20, a ground (GND) pin 22, and an output voltage (VOUT) pin 24.

Output current can be delivered to the VOUT pin 24 via the pass transistor 12, e.g., a field-effect transistor (FET). The gate voltage of the pass transistor 12 can be controlled by the output of the error amplifier 16, which compares a reference voltage generated by the bandgap voltage reference 14 to a feedback voltage at 26. The gate voltage of the pass transistor 12 is increased if the error amplifier 16 determines that the feedback voltage 26 is greater than the voltage generated by the bandgap voltage reference 14, which reduces the current through the pass transistor 12 and thus decreases the output voltage at VOUT pin 24.

As mentioned above, in typical bandgap voltage references, the output voltage requires trimming or adjusting so as to achieve a constant output voltage reference over a range of temperatures. Previous efforts include, for example, characterizing the output voltage temperature bow over multiple parts, and fixing the temperature coefficient (TC) trim code to a fixed value based on the best results of a set of parts. These previous efforts include testing the parts at a first temperature, e.g., ambient temperature, and a second temperature, e.g., much warmer than the first temperature, using an oven for example. These methods include a fixed TC code trimming methodology that does not involve self-heating the part to determine the change in output voltage versus change in die junction temperature/PTAT Current bias, as described in this disclosure.

Current and prior LDO accuracies achieve about +/−2% output voltage accuracy over line, load and temperature. Customers, however, are demanding higher accuracy regulation over line, load and temperature. Using the techniques of this disclosure, which are described in more detail below with respect to the flow chart in FIG. 2, an improved accuracy of +/−1% (or better) over line, load and temperature can be achieved.

Figure 2:
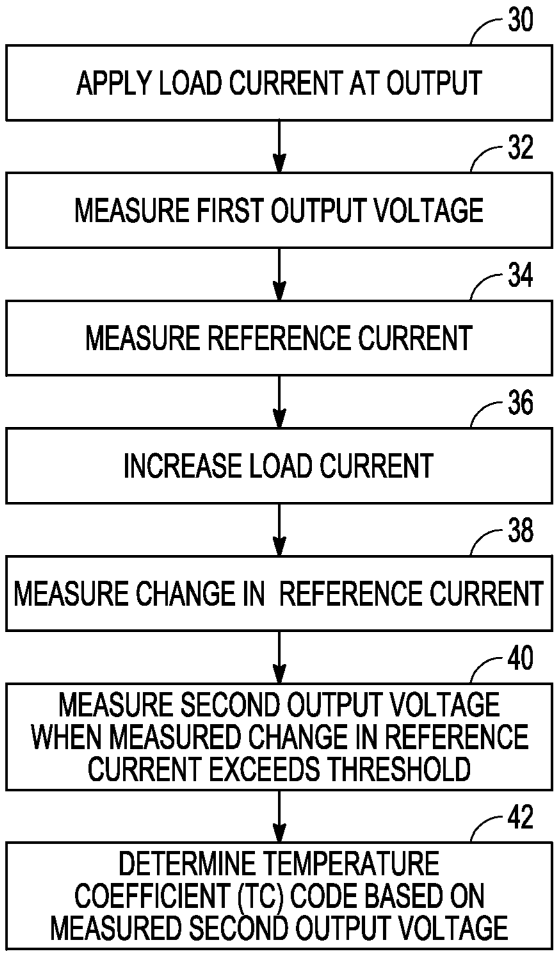
FIG. 2 is a flow diagram of an example of a self-heating trimming technique that can improve a voltage accuracy over line, load, and temperature, in accordance with this disclosure.

FIG. 2 is a flow diagram of an example of a self-heating trimming technique that can improve a voltage accuracy over line, load, and temperature, in accordance with this disclosure. The technique of FIG. 2 can be performed by automated test equipment (ATE) during production, as one non-limiting example. For purposes of conciseness, the techniques will be described below with respect to an ATE.

In one example implementation of the technique of FIG. 2, a voltage, e.g., 5 volts (V), can be applied to the input voltage pin 18 and to the enable pin 20 (both of FIG. 1). The ATE can apply a load to the output voltage pin 24 and apply a load current, e.g., 10 milliamps (mA) at the output pin 24 via the pass transistor 12 (FIG. 1)(block 30). In one specific example, the ATE can set the output voltage at 1.3 V. The ATE, for example, can measure the output voltage, e.g., a first output voltage, as the load is drawing the load current (block 32). In one example, the target output voltage is about 1.3 V.

In one example implementation, the ATE can set a test bit and enable a reference current to be muxed out of the device via the enable pin 20 (FIG. 1). In some examples, the ATE can measure the reference current, e.g., a PTAT current or a CTAT current (block 34). In one example, the target current out of the enable pin 20 is about 11 microamps. In some example implementations, the ATE can measure the reference voltage, e.g., PTAT or CTAT. It is desirable that the reference current or voltage changes linearly with temperature, whether that be positive or complementary to temperature.

Next, the ATE can increase the external load current (block 36). The ATE can, for example, slowly ramp the load current up at a constant rate, e.g., 1 mA per millisecond. By increasing the external load current, the power dissipation through the voltage regulator is increased, causing the voltage regulator part to self-heat. This results in a thermal increase in die junction temperature.

As the load current is increased, the ATE can measure a change in the reference current, e.g., an increase in PTAT or CTAT current or voltage (block 38). The ATE can accurately monitor the changing output voltage at the output voltage pin 24 (FIG. 1) in real time as the die junction temperature increases, thereby allowing the ATE to measure the change in output voltage versus the change in temperature/PTAT current source current.

When the ATE determines that the measured change in the reference current exceeds a threshold, the ATE can measure an output voltage, e.g., second output voltage (block 40). In some example implementations, the threshold is a 20% increase in reference current, e.g., PTAT or CTAT current. The 20% increase in current can correspond to about a 50 degree Celsius (° C.) increase in die temperature.

The ATE can determine a temperature coefficient (TC) trim code based on the measured second output voltage (block 42). As described in detail below with respect to FIG. 3, the trim code can be used to modify, e.g., increase or decrease, a resistance of a resistor to improve the temperature bow of the bandgap voltage reference. Thus, based on the change in output voltage versus PTAT current source current (which is representative of temperature), the bandgap reference TC code can be trimmed to minimize the change in output voltage versus die junction temperature (as measured through the PTAT bias current) and load current.

Set forth below in Table 1 is a set of example TC trim codes that can be used to increase/decrease a resistor value to improve the temperature bow of the bandgap voltage reference based on the change in the measured output voltage.

TABLE 1

| TC Code | Ivbgtc Bit<7> | Ivbgtc Bit<6> | VOUT@10 mA | VOUT@600 mA |
|---|---|---|---|---|
| 0 | 0 | 0 | 1.3016 | 1.2961 |
| 1 | 0 | 1 | 1.2796 | 1.2697 |
| 2 | 1 | 0 | 1.3254 | 1.3253 |
| 3 | 1 | 1 | 1.3508 | 1.3562 |

In Table 1, the TC Code column indicates the temperature coefficient trim codes available, e.g., 0-3. The Ivbgtc Bit <7> and Ivbgtc Bit <6> columns together indicate the two bits representing the TC code. The VOUT@10 mA column indicates the measured first output voltage at a light load of 10 mA. The VOUT@600 mA column indicates the measured second output voltage at an increased load of 600 mA.

In one example implementation of the techniques of this disclosure, if the change in VOUT is greater than +5 mV, the TC trim code "01" can be selected for trimming; if the change in VOUT is greater than −3 mV, the TC trim code "10" can be selected for trimming; otherwise, the TC trim code "00" can be selected for trimming. In applications that require less accuracy, the TC code of "11" can be selected.

Figure 3:
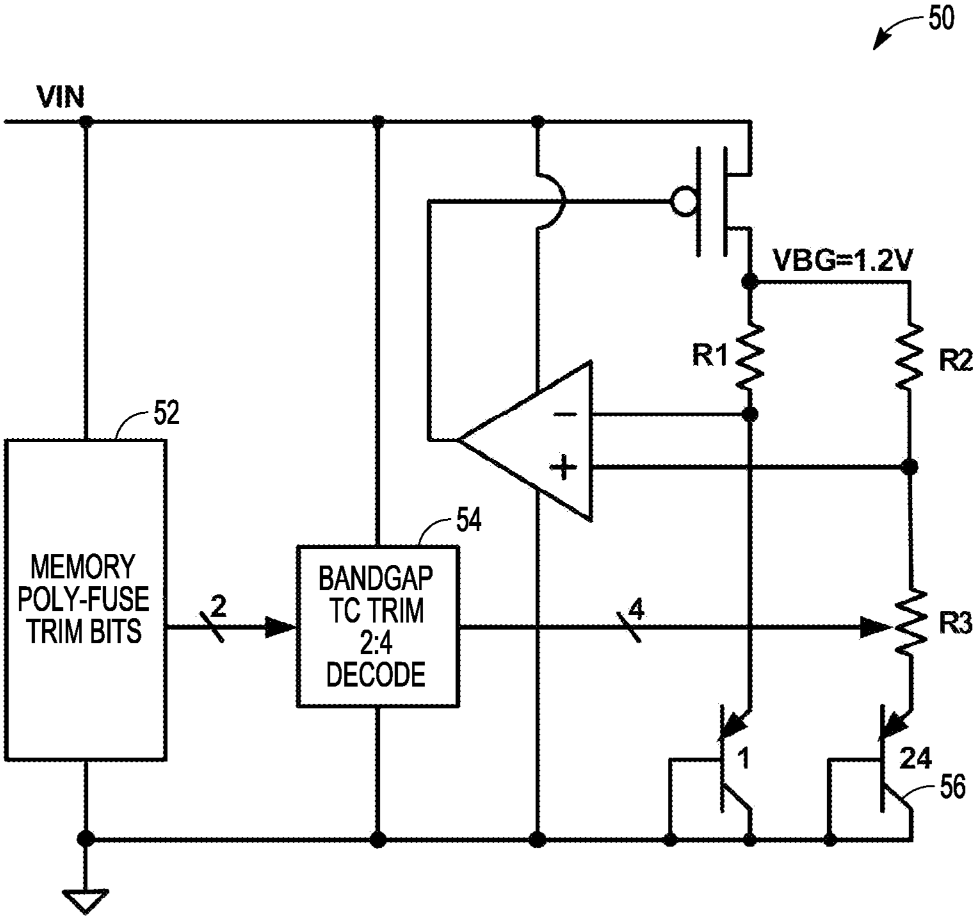
FIG. 3 is an example of a bandgap reference circuit that can be used in accordance with this disclosure.

FIG. 3 is an example of a bandgap reference circuit 50, e.g., bandgap voltage reference 14 of FIG. 1, that can be used in accordance with this disclosure. The TC trim code determined using the technique described with respect to FIG. 2 can be used to modify, e.g., increase or decrease, a resistor value to improve the temperature bow of the bandgap voltage reference. In some example implementations, a memory 52 can be used to store the determined trim code.

For example, in FIG. 3, the memory 52 can include a polysilicon fuse trim circuit. The ATE, for example, can burn and/or blow the polysilicon fuses either to a logic 0 or a logic 1, which sets the digital logic that represents the determined trim code, e.g., "01", "10", or "00". The two bits stored in the memory 52 are decoded by bandgap TC trim decoder 54. The decoder 54 can be a 2:4 decoder that generates a 4-bit signal from the 2-bit signal received from the memory 54. The O-bit signal generated by the decoder 54 can control one or more switches that, depending on their configuration, e.g., open or closed, determine a resistance of the variable resistor R3. The resistance R3 can determine the base-emitter voltage (VBE) of the transistor 56, which controls the PTAT voltage. In this manner, the output voltage of the bandgap reference circuit 50 can be trimmed.

Figure 4:
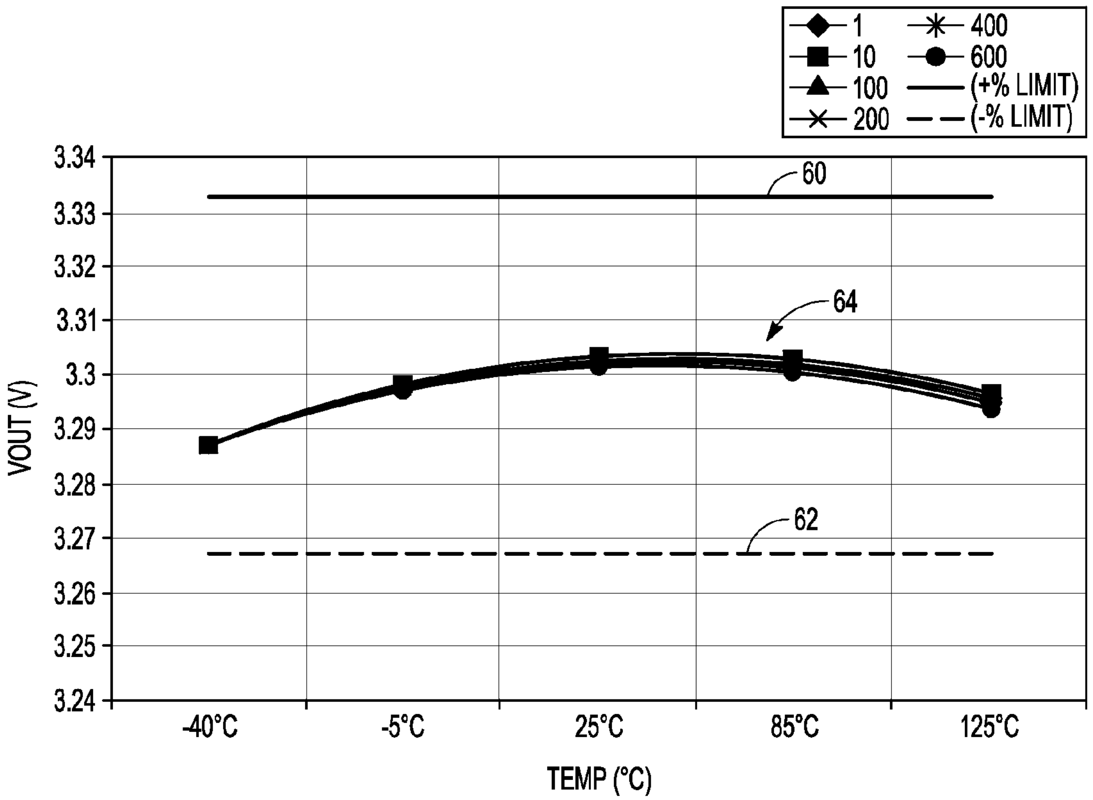
FIG. 4 is a graph illustrating output voltage versus temperature for a voltage regulator using the trimming techniques of this disclosure.

FIG. 4 is a graph illustrating output voltage versus temperature for a voltage regulator using the trimming techniques of this disclosure. In FIG. 4, the y-axis represents the output voltage and the x-axis represents the ambient temperature of the voltage regulator part.

As indicated above, the desired accuracy is +/−1% over line, load and temperature. The +1% limit is represented by line 60 and the −1% limit is represented by line 62. As seen in FIG. 4 at 64, the output voltages for load currents of 1 mA, 10 mA, 100 mA, 200 mA, 400 mA, and 600 mA stay within the +/−1% limits as the die temperature increases.

Figure 5:
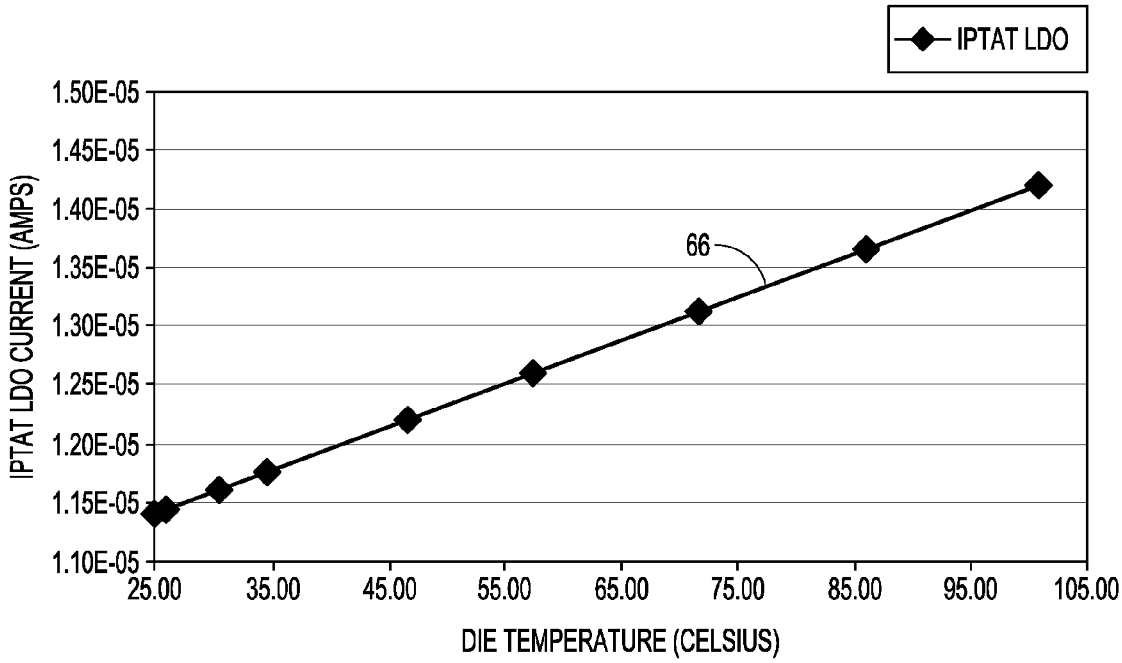
FIG. 5 is a graph illustrating the relationship between PTAT current and die temperature for a voltage regulator.

FIG. 5 is a graph illustrating the relationship between PTAT current and die temperature for a voltage regulator, e.g., an LDO regulator. In FIG. 5, the y-axis represents the PTAT current in amps and the x-axis represents the die temperature in degrees Celsius. The relationship between the PTAT current and the die for an LDO regulator is shown at line 66. As PTAT current is increased, the die temperature increases. At 25° C., the PTAT current is about 11.5 microamps and the PTAT current is about 14 microamps at about 100° C.

Figure 6:
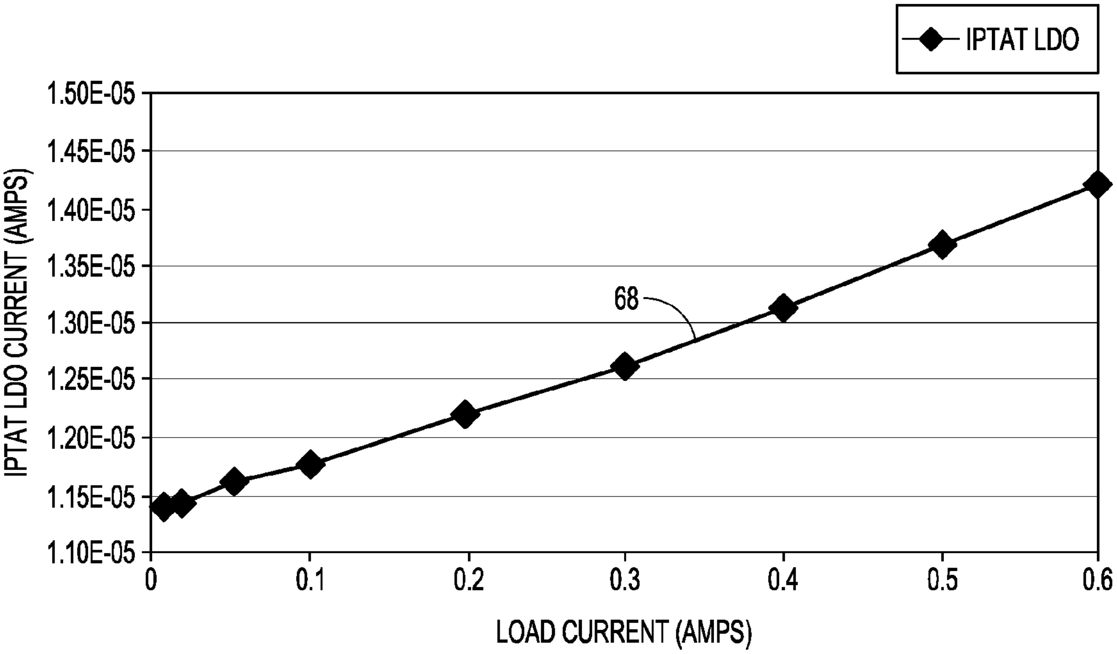
FIG. 6 is a graph illustrating the relationship between PTAT current and load current for a voltage regulator.

FIG. 6 is a graph illustrating the relationship between PTAT current and load current for a voltage regulator, e.g., an LDO regulator. In FIG. 6, the y-axis represents the PTAT current in amps and the x-axis represents the load current in amps. The relationship between the PTAT current and the load current for an LDO regulator is shown at line 68. As seen in FIG. 6, as the load current increase, the PTAT current increases. At a load current of about 100 milliamps, the PTAT current is about 11.7 microamps. Increasing the load current to 600 milliamps results in a PTAT current of about 14 microamps. The die temperature (not shown) is heating up in response to the increased power dissipation across the LDO regulator.

Figure 7:
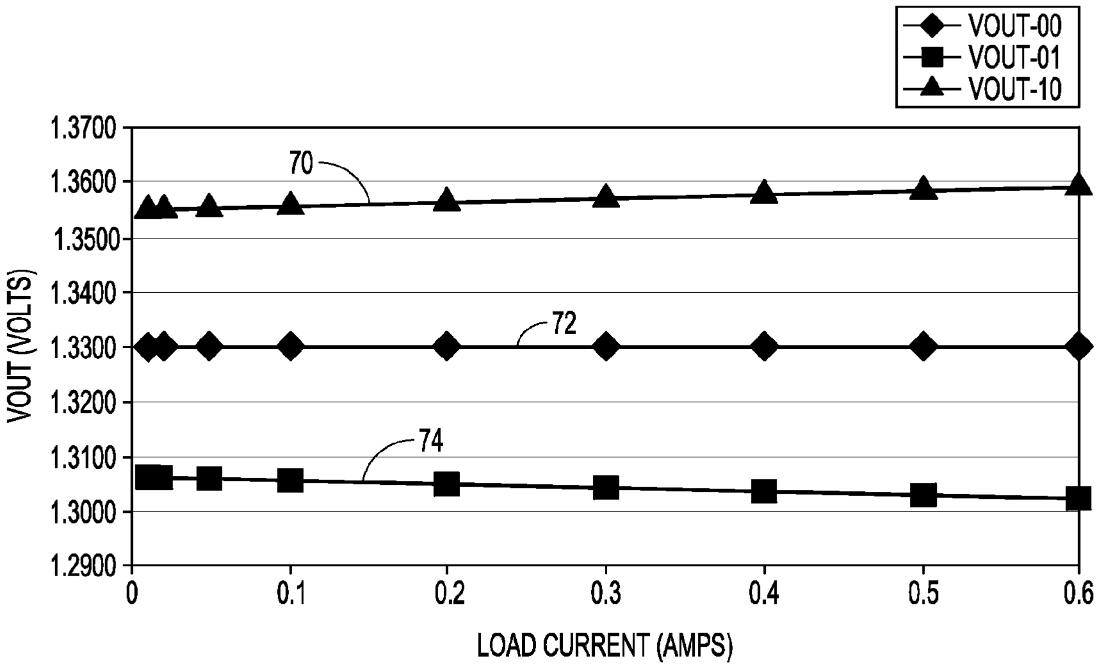
FIG. 7 is a graph illustrating output voltage versus load current for a voltage regulator using the trimming techniques of this disclosure.

FIG. 7 is a graph illustrating output voltage versus load current for a voltage regulator using the trimming techniques of this disclosure. More particularly, the graph in FIG. 7 the output voltage versus load current using three different TC trim codes. In FIG. 7, the y-axis represents the output voltage and the x-axis represents the load current.

A first output voltage is shown at line 70 where a light load current of 10 milliamps is increased stepwise to 600 milliamps for a TC trim code of "10". A second output voltage is shown at line 72 where a light load current of 10 milliamps is increased stepwise to 600 milliamps, for a TC trim code of "00". A third output voltage is shown at line 74 where a light load current of 10 milliamps is increased stepwise to 600 milliamps, for a TC trim code of "01". Based on the change in output voltage versus external load, correlating to die temperature, the best TC trim code can be selected for improved LDO output accuracy.

The trimming techniques of this disclosure can be implemented, for example, using complementary metal-oxide semiconductor (CMOS) circuitry, bipolar junction transistor circuitry, as well as a combination of bipolar and CMOS circuitry (BiCMOS).

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for compensating for a temperature effect during operation of a voltage regulator circuit, the method comprising:

applying a load current at an output of the voltage regulator circuit;

measuring a first output voltage at the output;

measuring a reference current or voltage;

increasing the load current;

measuring a change in the reference current or voltage corresponding to the increased load current;

measuring a second output voltage when the measured change in the reference current or voltage exceeds a threshold;

determining a temperature coefficient trim code using a difference between the measured first output voltage and the measured second output voltage; and modifying a resistance of a variable resistance based on the determined trim code to improve an output accuracy of the voltage regulator circuit over load current and temperature.

2. The method of claim 1, wherein the reference current is a proportional to absolute temperature (PTAT) current or voltage.

3. The method of claim 1, wherein the reference current is a complementary to absolute temperature (CTAT) current or voltage.

4. The method of claim 1, comprising:

applying only one ambient temperature to the voltage regulator circuit when applying the load current and increasing the load current.

5. The method of claim 1, wherein the threshold is about a 20% increase in the reference current or voltage.

6. The method of claim 1, wherein the threshold is specified as corresponding to an equivalent change in a die temperature of a die of the voltage regulator circuit.

7. The method of claim 1, wherein determining a trim code using the measured first output voltage and the measured second output voltage includes determining at least one bit representing the determined trim code.

8. The method of claim 1, wherein modifying a resistance of a variable resistance based on the determined trim code includes:

modifying a resistance of a variable resistor of a bandgap voltage reference circuit based on the determined trim code.

9. The method of claim 8, modifying a resistance of a variable resistance based on the determined trim code includes:

burning or blowing at least one polysilicon fuse.

10. The method of claim 1, wherein the voltage regulator circuit is a low-dropout regulator.

11. The method of claim 1, wherein the voltage regulator circuit includes complementary metal-oxide semiconductor (CMOS) circuitry.

12. The method of claim 1, wherein the voltage regulator circuit includes bipolar junction transistor circuitry.

13. The method of claim 1, wherein the voltage regulator circuit includes both complementary metal-oxide semiconductor (CMOS) circuitry and bipolar junction transistor circuitry.

14. The method of claim 1, wherein measuring a reference current or voltage includes:

applying a test mode bit to the voltage regulator circuit; and measuring the reference current out of a pin of the voltage regulator circuit.

15. A method for compensating for a temperature effect during operation of a low dropout regulator circuit, the method comprising:

applying only one ambient temperature to the voltage regulator circuit;

applying a load current at an output of the voltage regulator circuit;

measuring a first output voltage at the output;

measuring a reference current;

increasing the load current;

measuring a change in the reference current corresponding to the increased load current;

measuring a second output voltage when the measured change in the reference current or voltage exceeds a threshold;

determining a temperature coefficient trim code using a difference between the measured first output voltage and the measured second output voltage; and modifying a resistance of a variable resistor based on the determined trim code by burning or blowing at least one polysilicon fuse to improve an output accuracy of the low dropout regulator circuit over load current and temperature.

* * * * *